United States Patent [19]

Johansson et al.

[11] 4,396,891

[45] Aug. 2, 1983

[54] GAIN CONTROL CIRCUIT

[75] Inventors: Jan H. Johansson, Balsta; Bengt O. Berg, Solna, both of Sweden

[73] Assignee: Telefonaktiebolaget L M Ericsson, Stockholm, Sweden

[21] Appl. No.: 191,769

[22] PCT Filed: Feb. 20, 1980

[86] PCT No.: PCT/SE80/00047
§ 371 Date: Nov. 9, 1980
§ 102(e) Date: Sep. 29, 1980

[87] PCT Pub. No.: WO80/01975
PCT Pub. Date: Sep. 18, 1980

[30] Foreign Application Priority Data

Mar. 9, 1979 [SE] Sweden .............................. 7902171

[51] Int. Cl.³ .......................... H03G 3/30; H03F 3/45
[52] U.S. Cl. ...................................... 330/254; 330/260
[58] Field of Search ................... 330/254, 260; 358/27

[56] References Cited

U.S. PATENT DOCUMENTS 3,452,289  6/1969  Ryan ................................. 330/254

FOREIGN PATENT DOCUMENTS 2291642  6/1976  France ............................... 330/254

Primary Examiner—James B. Mullins
Attorney, Agent, or Firm—Hane, Roberts, Spiecens & Cohen

[57] ABSTRACT

A gain control circuit includes at least a first (T1, T2) and a second (T3, T4) transistor differential amplifier the input circuits of which are connected in parallel to a signal voltage source. The gain control is performed by distributing a constant current (Is) between these differential amplifiers as a function of a control quantity (Uc) for setting the transconductance of the stages in a complementary way. The two differential amplifiers are provided with negative feed back (F, R1, R2, R3) but with different feed back factors. As the transistors in the differential amplifiers carrying signals of the same phase are interconnected the output signal from the automatic gain control circuit will consist of a superposition of the output signals of the two differential amplifiers.

4 Claims, 2 Drawing Figures

GAIN CONTROL CIRCUIT

FIELD OF THE INVENTION

The present invention relates to a gain control circuit suitable for implementation in a monolithic device and substantially intended to be used in line and microphone amplifiers for telephone instruments.

DESCRIPTION OF PRIOR ART

It is known to use differential amplifier stages in gain control circuits intended to be included in amplifiers designed in an integrated circuit. By means of these stages it is possible to design temperature stable amplifiers. Gain control circuits of this type are for example described in the U.S. Pat. No. 3,684,974 or in the German Pat. No. 2 262 580.

A gain control circuit according to the above mentioned patents operates according to the current sharing principle implying that the signal current is shared by one or more differential stages, the shares being determined by a control current. The controlled signal voltage is taken out across one (or more) load impedances where the current share determined by the control voltage is transformed into an output voltage.

SUMMARY OF THE INVENTION

The gain control circuits previously known are intended as volume controls in radio sets and audio amplifiers. Therefore, they must have a large control range whereas the total gain and a possible drift of the gain is of minor importance. It is also obvious that gain control circuits of this type cannot be used in telephone instruments with their great demands on the nominal attenuation as well as of the control range. The tolerated deviation from the specified attenuation value is of magnitude ±0.1 dB when the control range is 6 dB.

An object of the present invention is to achieve a gain control circuit which fulfils the above requirements by including at least a first and a second transistor differential amplifier whose inputs are connected in parallel to a signal source and (the characteristics of the invention appear from the appended claims). A gain control circuit according to the invention thoroughly fulfils the demands for a defined amplification required in an amplifier for telephone purposes at the same time as low noise, low distortion and low power consumption are obtained.

BRIEF DESCRIPTION OF THE DRAWING

The invention will be more fully described with reference to the accompanying drawing, where.

PREFERRED EMBODIMENTS

Figure 1:
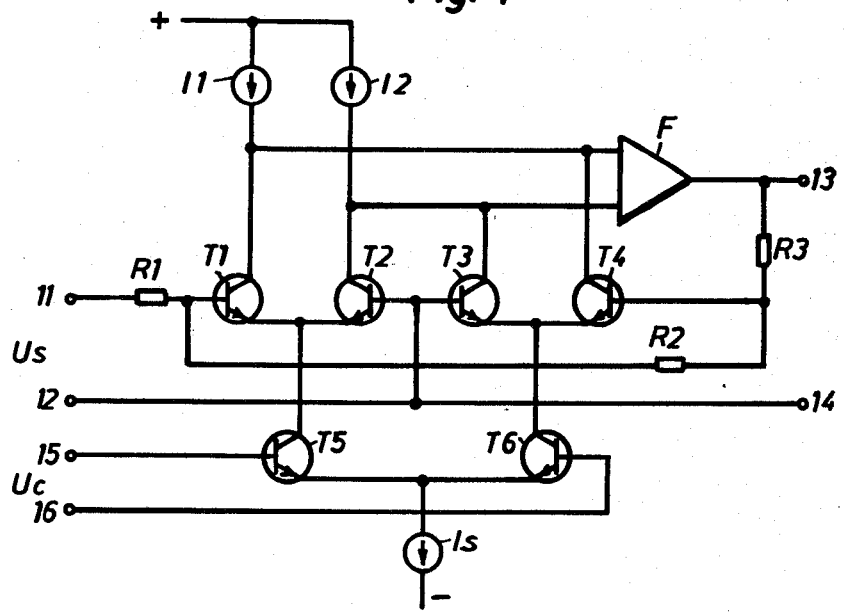
FIG. 1 shows a gain control circuit according to the invention with an unbalanced output.

The circuit shown in FIG. 1 includes a first differential stage with the transistors T1 and T2, a second differential stage with the transistors T3 and T4 and a third differential stage with the transistors T5 and T6. A signal is applied across the input terminals 11 and 12. The input 11 is connected through the resistor R1 to the base of the transistor T1 and through the resistors R1 and R2 to the base of the transistor T4. The base electrodes of the transistors T2 and T3 are interconnected and connected to the input 12 and the output 14. The collectors in the transistors T1 and T4 are connected to a constant current source I1 and to an input of an amplifier F while the collectors of the transistors T2 and T3 are connected to a constant current source I2 and the second input of the amplifier F. The interconnected emitters of the transistors T1 and T2 are connected to the collector of the transistor T5 in the third differential amplifier. The collector of the transistor T6 in the same differential amplifier is connected in the same way to the emitters of the transistors T3 and T4. The emitters of the transistors T5 and T6 are connected to a constant current source Is. The base electrodes of the transistors T5 and T6 are connected to a DC control voltage Uc. There is a negative feed back from the output of the amplifier F through the resistor R3 to the base circuit of the transistor T4 (directly) and the transistor T1 (through R2). Thus the differential amplifiers T1, T2 and T3, T4 have different negative feed back factors.

The circuit operates in the following way. The sharing of the constant current Is between the transistors T5 and T6 can be controlled through the DC voltage Uc. This implies that the emitters in the differential amplifiers T1, T2 and T3, T4 receive corresponding currents. It is well known that the amplification of a differential stage increases with the emitter current. If, for example, the greater part of the current Is is sent through transistors T1, T2 while the transistors T3, T4 carry a very small current, the differential amplifier T1, T2 will amplify the input signal with maximum amplification while the contribution from T3, T4 is negligible. The negative feed-back circuit including the amplifier F gives a loop amplification which is proportional to $(R3+R2)/R1$. On the other hand if the greater part of the current Is is sent through the differential amplifier T3, T4 this amplifier will amplify the input signal and the amplification will be proportional to $R3/(R2+R1)$, i.e., it will be lower than in the first case. These two extreme cases determine the limits for the control range. Other current sharings give gains between these limis. An analysis of the circuit gives the following expression for the total gain A of the circuit $$A = \frac{A1(1 + \beta 2) + A2(1 + \beta 1)}{(1 + \beta 1)(+ \beta 2) + A1 \cdot \beta 1)(1 + \beta 2) + A2(1 + \beta 1)}$$

where A1 is the gain of the differential amplifier T1, T2, A2 is the gain in the differential amplifier T3, T4 and $\beta 1$ and $\beta 2$ are the negative feed back factors for the corresponding negative feed back network R3+R2; R1, and R3; R2+R1, respectively.

In a specific embodiment the negative feed back network was so dimensioned that the amplifier had the gains 20 dB and 26 dB at the limits of the control voltage. For all intermediate values of the DC voltage signal the gain was kept within the limits required for telephone amplifiers and the gain control was stable within given tolerances.

Figure 2:
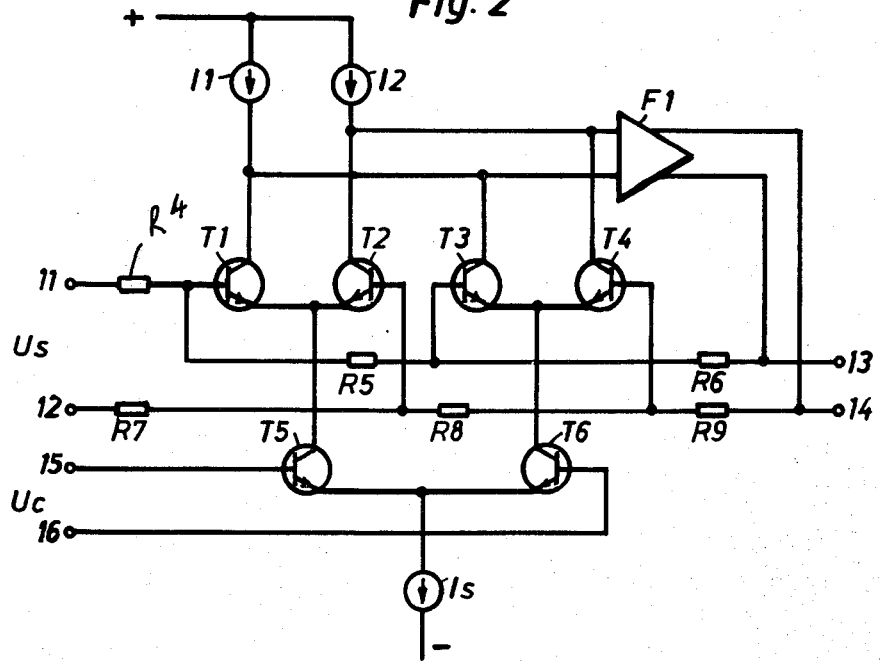
FIG. 2 shows a similar circuit with a balanced output.

FIG. 2 shows a modified gain control circuit according to the invention with the negative feed back amplifier F1 where both the input and the output are balanced. In this case collectors of the transistors T1 and T3 are connected together as well as the collectors of the transistors T2 and T4. The input 11 is connected to the base of the transistor T1 through the resistor R4 and to the base of the transistor T3 through the resistors R4 and R5. One output of the amplifier F1 is connected as well to the output 13, as to the base of the transistor T3 through the resistor R6. In a similar way the input 12 is connected to the base of the transistor T2 through the resistor R7 and to the base of the transistor T4 through the resistors R7 and R8 while the second output of the amplifier F1 is connected as well to the output 14, as to the base of the transistor T4 through the resistor R9. The bases of the transistors T2 and T3 are not connected together in this case. The circuit according to FIG. 2 essentially works in the same way as described for the circuit of FIG. 1, the only difference being that also the negative feed back circuit is balanced.

When employing conventional transistors the output terminals are the collectors of the transistors, the input terminals are the bases of the transistors and the common terminals are emitters of the transistors.

What we claim is:

1. A gain control circuit comprising: first and second transistor differential amplifiers, each of said amplifiers having an input terminal means, output terminal means and common terminal means; means for applying an input signal to be amplified in parallel to each of said input terminal means; means for applying an operating current through said differential amplifiers via said output terminal means and said common terminal means, said applying means comprising signal amplifying means having an input terminal means, an output terminal means and a common terminal means, a constant current source connected to said common terminal means, means for connecting said output terminal means simultaneously to the common terminals of said differential amplifiers, and means for applying a continuously variable control signal to the input terminal means of said signal amplifying means negative feedback means connecting said output terminal means of said differential amplifiers to said input terminal means of said differential amplifiers, said negative feedback means being so dimentioned that said differential amplifiers together with said negative feedback network have different loop gains for the same current passing through their common terminals.

2. The gain control circuit of claim 1 further comprising output amplifier means having input circuit means connected to the output terminal means of said differential amplifiers and output circuit means connected to the input terminal means of said differential amplifiers.

3. The gain control circuit of claim 2 wherein said input circuit means, said output circuit means and said negative feedback means are balanced.

4. The gain control circuit of claim 1 wherein said signal amplifying means is a differential amplifier.

* * * * *